Figure 1:
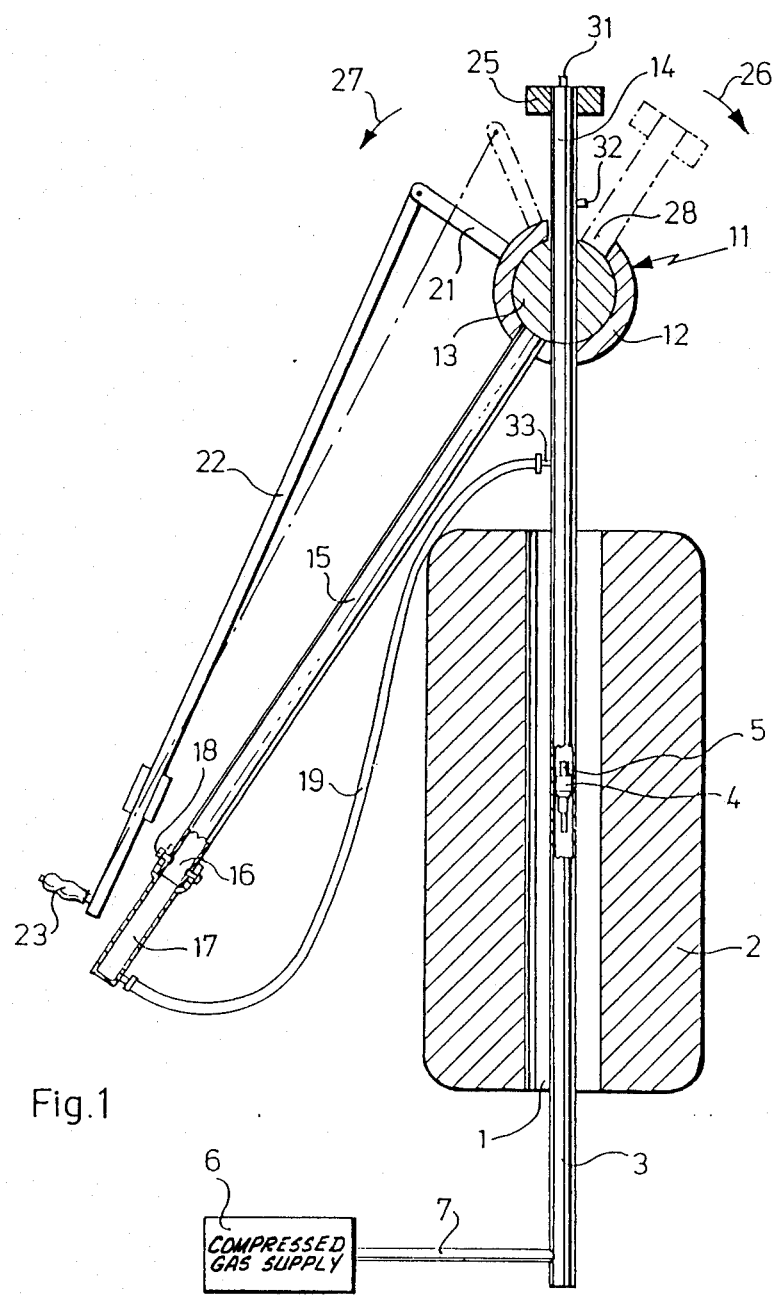

United States Patent [19]

Kuster

[11] Patent Number: 4,859,948
[45] Date of Patent: Aug. 22, 1989

[54] DEVICE FOR POSITIONING A SAMPLE CARRIER IN AN NMR SPECTROMETER

[75] Inventor: Anton Kuster, Greifensee, Switzerland

[73] Assignee: Spectrospin AG, Zurich, Switzerland

[21] Appl. No.: 238,043

[22] Filed: Aug. 29, 1988

[30] Foreign Application Priority Data

Sep. 5, 1987 [DE] Fed. Rep. of Germany ....... 3729819

[51] Int. Cl.[4] ............................................. G01R 33/20
[52] U.S. Cl. ..................................... 324/318; 324/300
[58] Field of Search ............... 324/300, 307, 309, 318, 324/319, 321, 322

[56] References Cited

U.S. PATENT DOCUMENTS

| 4,511,841 | 4/1985 | Bartuska | 324/318 |
| 4,581,583 | 4/1986 | Van Vliet | 324/321 |
| 4,587,492 | 5/1986 | Laudermilch | 324/318 |

FOREIGN PATENT DOCUMENTS 0197791 4/1986 European Pat. Off. .

OTHER PUBLICATIONS

Rev. Sci. Instrum. 57(3), Mar. 1986, A. Bielecki, D. B. Zax, K. W. Zilm and A. Pines: "Zero-field NMR and NQR and NQR spectrometer", pp. 393-403.

*Primary Examiner*—Michael J. Tokar
*Attorney, Agent, or Firm*—Walter A. Hackler

[57] ABSTRACT

In the case of NMR spectrometers comprising a cryomagnet with vertical axis, the sample to be examined is introduced into the measuring area of the magnet by means of a sample carrier which is arranged in a guide tube passing axially through a central space of the craymagnet, and can be moved therein by means of a flow of compressed air. For changing the sample, one switches on the compressed air flow so that the sample carrier is raised to the upper end of the guide tube where the sample can be changed. With increasing sizes of the cryomagnets, the upper end of the guide tube is no longer accessible without an aid (ladder or platform). The invention therefore provides that a direction switch is arranged at the upper end of the guide tube and that an inclined tube extends from the said direction switch to an easily accessible point, for inserting and removing the sample carrier at its end. By guiding the flow of compressed air in a suitable manner and switching over the direction switches as required, the sample can then be moved from the measuring area to the end of the inclined tube, and vice versa, so that the difficulties described before are no longer encountered.

8 Claims, 2 Drawing Sheets

DEVICE FOR POSITIONING A SAMPLE CARRIER IN AN NMR SPECTROMETER

The present invention relates to a device for positioning a sample carrier in an NMR spectrometer comprising an intense-field cryomagnet with vertically arranged axis producing a homogeneous static magnetic field in a predetermined measuring area, and a vertical guide tube passing through the said measuring area and carrying at its upper end a sample-changing device for transporting and removing a sample carrier to or from the guide tube, and comprising further and arrangement for supplying pressurized gas to the lower end of the guide tube by means of which the gas supplied to the guide tube can be measured in such a manner that a sample carrier, having been transferred to the guide tube, can be selectively lowered from the upper end of the guide tube to the measuring area of the cryomagnet, for performing a measurement, and raised subsequently to the upper end of the guide tube for removing the sample carrier.

A device of this type has been previously known, for example from U.S. Pat. No. 45 81 583 and EP 01 97 791 A2. The sample-changing device of the one of these devices consists of a magazine comprising a rotating sample holder with nests intended for receiving sample carriers and adapted for being positioned above the end of the guide tube, while the other device comprises a robot arm for removing sample carriers from a magazine and transferring them to the guide tube, and vice versa. However, these devices are complex and do not lend themselves for economic use when samples are to be examined individually, not in series.

Where the sample carriers are not positioned automatically, it is a disadvantage of the device for introducing or removing the sample into or out of the measuring area of the cryomagnet of an NMR spectrometer, which is sometimes also described as "automatic lift", that in the case of big magnet arrangements the upper end of the guide tube is no longer accessible for the user of the spectrometer from the floor of the room where the magnet arrangement is installed. For changing the sample, the user then has to use a ladder, or a platform must be built up beside the magnet arrangement. However, quite apart from the fact that the necessity to use a ladder is troublesome and the arrangement of a platform is expensive, the necessary space for the erection of a ladder or a platform must be available beside the magnet arrangement. This may lead to considerable restrictions when selecting the location for the magnet arrangement. In addition, any environmental variations over time that might influence the very intense magnetic field and the sensitive measuring equipment of the NMR spectrometer should be avoided, and man should also as far as possible keep clear of the intense magnetic field which constitutes a certain danger. Under these aspects, too, certain problems are encountered in the case of the before-mentioned devices, on the one hand in connection with the loading of the sample holders arranged at the upper end, and on the other hand as regards the robot operating in the direct neighborhood of the cryomagnet.

Now, it is the object of the present invention to design a device of the type described above in such a manner that the sample can be changed by the user of the NMR spectrometer from an easily accessible point and that no significant additional space is required for such a device.

This object is achieved according to the invention by the fact that the sample-changing device comprises an inclined tube leading from a point neighboring the upper end of the guide tube to an easily accessible point outside the magnet arrangement where it is provided with an opening with a closure for inserting and removing the sample carrier, and further a direction switch comprising a tube section that can be brought into alignment selectively with the guide tube or with the inclined tube, and that the device for supplying the pressurized gas can be connected also to the closed lower end of the inclined tube and controlled in such a manner that the sample carrier, after having been raised in the guide tube into the area of the direction switch in the condition where the tube section is aligned with the guide tube, can be lowered for removing the sample, after changing-over the position of the direction switch in the inclined tube, and vice versa.

Accordingly, it is ensured in the case of the magnet arrangement according to the invention that once the sample has been raised by means of the guide tube to a point above the magnet structure it can be lowered by means of the inclined tube along the outside of the magnet structure to a point which is easily accessible for the user of the spectrometer. This point may be in the direct neighborhood of the spectrometer console, i.e. in the direct neighborhood of the normal workplace of the user of such a spectrometer. The design of the sample transport system requires no notable additional space, nor any expensive or complicated additional arrangements. This is true in particular when air is used as gas for transporting the sample. Another suitable gas is nytrogen which is available as pressurized gas in cylinders. Whenever the term "compressed air" is used hereafter, it is meant to include any suitable pressurized gaseous medium.

Inserting and removing the sample carrier at the lower end of the inclined tube may be facilitated if a unilaterally closed, detachable end piece comprising a chamber for receiving the sample carrier is arranged at the lower end of the inclined tube. This end piece is of course designed in such a manner that the sample carrier is easily accessible for insertion and removal, and is safely retained in the end piece. The connection between the end piece and the inclined tube may be realized, for example, by means of a bayonet closure, or else by a resilient click-on connection, or the like.

For controlling the movement of the sample carrier only three operating conditions are required for the compressed-air system, just as in the arrangements known heretofore, namely one for raising the sample, one for lowering the sample and one causing it to be held in a floating condition if, according to a further improvement of the invention, the direction switch comprises a movable section for closing the other tube tightly when the tube section of the direction switch is in alignment either with the guide tube or with the inclined tube, and if in addition the guide tube is connected to the closed end of the end piece by a flexible line connected to the guide tube at a distance from its upper end which is at least equal to the length of the sample carrier. Depending on the switching position, the sample carrier is then raised and lowered in the guide tube or the inclined tube, it being simultaneously ensured that the sample carrier can be transferred from the respective tube to the direction switch, and vice versa, only when the direction switch is in correct alignment with the respective tube.

The direction switch can be adjustable in a simple manner by means of a manually operated lever mechanism forming together with the direction switch an overall system which in the operating positions, in which the direction switch is aligned either with the guide tube or with the inclined tube, has its center of gravity located lower than in all intermediate positions.

The lever mechanism required for manual operation may have an extremely simple design and may be arranged in the immediate neighborhood of the guide tube so that no notable additional space is required. By designing the system comprising the lever mechanism and the direction switch in such a manner that the center of gravity of the overall system is located at the highest point in all intermediate positions of the system, between the operating positions, one ensures directly that the direction switch always tends to get into one of its operating positions, and occupies a safe rest position in each of these operating positions.

The sample transport system may of course be equipped with additional features making its operation even more convenient for the user, if the expense caused by such arrangements is regarded as justified. Especially in cases where the inclined tube is to end in the area of the console of the spectrometer, the end piece arranged at the inclined tube may be the tube section of another rotary direction switch connected to a substantially vertical, upwardly open sample-receiving tube. This upwardly open sample-receiving tube may end, for example, in the table top of a console in which case the sample carrier can be positioned very easily in the receiving tube from above. The overall arrangement may then be designed in such a manner that a sample which has been ejected from the magnet will project beyond the upper end of the receiving tube so that it can be easily gripped and removed.

The additional direction switch may be mechanically coupled in this case with the direction switch arranged at the upper end of the guide tube in order to ensure that the tube sections of both direction switches are in alignment with the inclined tube every time the sample carrier is to be transported from the one direction switch to the other. However, such an arrangement would also provide the possibility to have the direction switch and the means for supplying compressed air automatically adjusted, i.e. controlled, by a control unit in response to sensors arranged in the area of the direction switches so that for inserting or removing a sample it would be necessary only to actuate a switch on the console whereby all necessary operations would be initiated.

The invention will now be described in more detail with reference to the embodiments illustrated in the drawing. The features that can be derived from the description and the drawing may be used in other embodiments of the invention either individually or in any desired combinations thereof.

Figure 2:
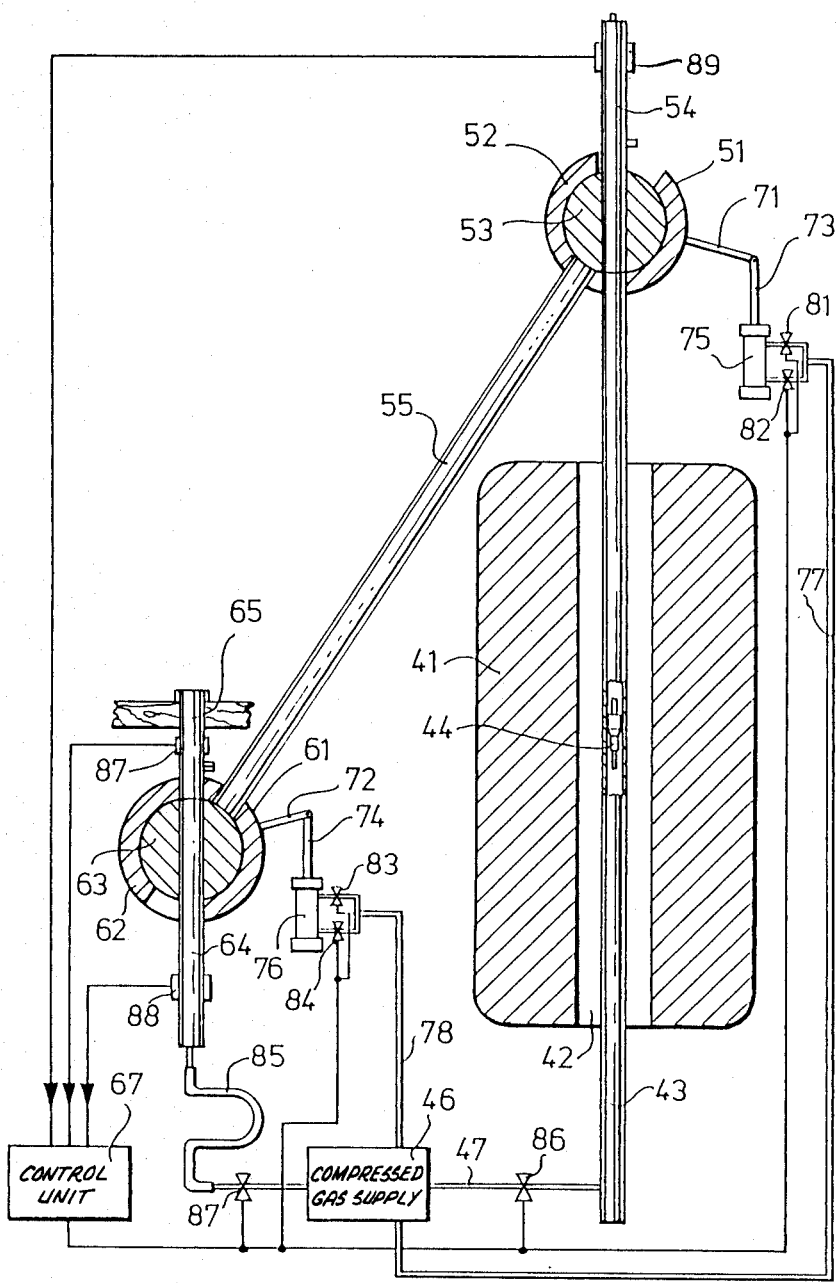

FIGS. 1 and 2 show diagrammatic representations of a magnet arrangement equipped with a sample transport system according to the invention.

In the arrangement shown in FIG. 1 the central space 1 of a cyromagnet 2—indicated only diagrammatically—is passed by a guide tube 3 containing a sample carrier 4. The cryomagnet 2 is part of an NMR spectrometer intended for examining a sample 5 which has been transported, by means of the sample carrier 4, into the homogeneous area of the magnet field generated by the cryomagnet 2. The means for transporting the sample carrier 4 into this homogeneous area of the magnetic field, which is found approximately at the center, but frequently also below the center, of the cryomagnet 2, is compressed air which is supplied to the guide tube 3 from a system 6 which is connected to the lower end of the guide tube by means of a tube 7 and which also serves to remove the sample carrier 4, together with the sample 5, later from the measuring area of the cryomagnet 2. The quantity of compressed air supplied may be increased for this purpose in such a manner that the sample carrier 4 is carried to the upper end of the guide tube 3 where a direction switch 11 is arranged comprising a cylindrical housing 12 and a rotary slide 13 mounted therein and comprising a tube section 14 which, in the position of the rotary slide 13 shown in FIG. 1, is in alignment with the guide tube 3. The arrangement 6 serving for supplying compressed air may consist of a blower, a compressor, a compressed-air tank, or the like. It is further understood that the expression "compressed air" which is used herein for the sake of simplicity is meant to describe also any other compressed gas. In fact, one often uses nytrogen in practice, in which case the arrangement 6 consists simply of a nytrogen cylinder.

The housing 12 of the direction switch 11 further accommodates an inclined tube 15 arranged in the same plane as the guide tube 3, namely a plane vertical to the axis of the rotary slide 13. Starting at the direction switch 11, the inclined tube 15 extends along the outside of the cryomagnet 2 and ends at 16 at a point which is easily accessible for the user of the spectrometer. The end 16 of the inclined tube carries an end piece 17, which may be retained thereon for example by a bayonet connection of which only the pins 18 engaging matching slots in the end piece 17 are shown in FIG. 1. The lower closed end of the end piece 17 is connected to the upper end of the guide tube 3 via a flexible line 19. The tube section 14 of the direction switch 11 can be aligned with the inclined tube 15 by turning the rotary slide 13.

For actuating the rotary slide 13, a simple lever mechanism is provided consisting of a crank arm 21 fixed to the rotary slide and a connecting rod 22 which is pivoted on the end of the crank arm 21 and which reaches down to the lower end of the inclined tube 15 where it is equipped with a handle 23. The connecting rod 22 is held in a guide 24 near its lower end. It will be readily seen that by actuating the connecting rod 22, by its handle 23, the rotary slide 13 can be moved from the position shown in the drawing into the position indicated by dash-dotted lines, in which the tube section 14 is in alignment with the inclined tube 15. In this latter position, a weight 25 arranged at the end of the tube section 14 exerts upon the rotary slide 13 a torque which acts in the direction indicated by arrow 26 and which is greater than the oppositely directed torque indicated by arrow 27 and exerted on the rotary slide 13 by the lever system comprising the crank arm 21 and the connecting rod 22. The direction switch 11, therefore, is in a stable condition in the position indicated by dash-dotted lines in which the tube section 14 is aligned with the inclined tube 15. Such a stable condition is also obtained when the rotary slide 13 occupies the position which is represented in full lines in FIG. 1 and in which the tube section 14 is in alignment with the guide tube 3, because in this position the torque exerted by the weight located vertically above the axis of the rotary slide 13 is practically equal to zero so that it will be outweighed by the torque exerted in the direction indicated by arrow 27 by the crank arm 21 and the connecting rod 22. The direction switch 11, therefore, has two stable positions in which the tube section 14 is aligned either with the guide tube 3 or with the inclined tube 15. These positions are defined by the contact between the tube section 14 and the ends of a recess 28 provided in the housing 12 of the direction switch.

Given the fact that the torque exerted upon the rotary slide 13, relative to the axis of rotation of the rotary slide 13, is determined by the position of the center of gravity of the mass consisting of the rotary slide 13, the tube section 14 with the weight 25, and the system consisting of the lever mechanism comprising the crank arm 21 and the connecting rod 22, the center of gravity must necessarily be located in the one case on the one side and in the other case on the other side of a vertical plane extending through the axis of rotation of the rotary slide 13. Given further the fact that the centre of gravity must necessarily move along an arc of a circle whose center is located on the axis of rotation of the rotary slide and whose highest point is found vertically above the same axis of rotation, the common center of gravity of the system must, in those operating positions in which the tube section 14 of the direction switch is aligned either with the guide tube 3 or with the inclined tube 5, be located lower than in all intermediate positions.

It is readily seen that in the position of the rotary slide 13 illustrated in FIG. 1 the sample carrier 4 can be raised in the guide tube by increasing the compressed-air supply until the sample carrier reaches the upper end of the tube section 14 which in this position is in alignment with the guide tube 3. An opening 31 provided at the end of the tube section 14 permits the air, which is pressed upwardly and out of the guide tube 3 by the rising sample carrier 4, to escape in a controlled manner while an opening 32 provided at a certain distance from the end of the tube section 14 permits the compressed air to escape after the sample carrier 4 has passed this opening so that the sample carrier will not be subjected to excessive pressure in its upper end position, while being on the other hand safely retained also in this position. The compressed air supplied to the inclined tube 15 via line 19 at the lower end of the end piece 17 remains without effect in the position illustrated in the drawing because the upper end of the inclined tube 15 is blocked in this position by the rotary slide 13 of the direction switch 11. Now, when the rotary slide 13 of the direction switch 11 is rotated, by corresponding actuation of the connecting rod 22, the end of the tube section 14 located inside the rotary slide 13 is moved into the area of the opening of the inclined tube 15 before the connection with the guide tube 3 is fully interrupted. This means that during a certain transition phase the sample carrier 4 is held in the tube section 14 by compressed air supplied partly via the guide tube 3 and partly via the inclined tube 15. Once the rotary slide 13 has reached the position shown in the drawing by dash-dotted lines, in which the tube section 14 is in alignment with the inclined tube 15, the sample carrier 4 is subjected to the action of compressed air which, although being supplied to the guide tube 3, flows through the line 19 and the end piece 17 into the inclined pipe 15 and from there into the tube section 14 as the guide tube 3 is now blocked at its upper end by the rotary slide 13. By reducing the supply of compressed air, the sample carrier can now be lowered into the end piece 17 provided at the lower end of the inclined pipe 15 in the same manner in which the sample carrier is lowered into the measuring area. One then only has to take off the end piece 17 for removing the sample carrier 4, together with the sample 5, from the sample-receiving space provided for this purpose in the end piece 17, and for exchanging it against another sample carrier with a new sample. Once the end piece 17 has been attached again, the sample carrier can then be raised again into the tube section 14 of the direction switch 11, by increasing the compressed-air supply correspondingly, and then lowered in the usual manner into the measuring area of the cryomagnet 2 by pulling the connecting rod 22 to actuate the direction switch 11.

The described arrangement provides a high degree of operating safety, in spite of its very simple design. For example, a sample carrier located in the end piece 17 can be moved to the direction switch only when the tube section 14 is aligned with the inclined tube 15, because otherwise, as will be readily seen from FIG. 1, the compressed air supplied to the guide tube will escape through the openings 31, 32 in the tube section 14 communicating with the guide tube 13, while on the other hand the inclined tube 15 cannot accept any air being closed at its upper end by the rotary slide 13. If, however, the direction switch 11 is set to the inclined tube 15 while the sample carrier is located in the guide tube 3, then the sample carrier 4 may in fact be raised when the compressed-air supply is increased, but only so long as it remains below the connection 33 for the flexible line 19, because the air which is displaced by the sample carrier 4 can escape through the line 19 and the upwardly open inclined pipe 15; the compressed air supplied to the guide tube 3 will, however, escape in the same manner as soon as the sample carrier 4 has passed the before-mentioned connection and will then have no significant effect because a cushion of condensed air is formed above this connection, in the section of the guide tube blocked by the rotary slide 13, which keeps the sample carrier away from the rotary slide 13 of the direction switch 11.

The invention illustrated in FIG. 2 comprises again a cryomagnet 41 whose central space 42 is passed by a guide tube 43 which serves for transporting a sample carrier 44, together with its sample, into the homogeneous area of the magnetic field generated by the cryomagnet 41. The sample carrier 44 is again moved in the guide tube 43 by compressed air which is supplied to the lower end of the guide tube 43 by a corresponding arrangement 46, via a tube 47.

However, this embodiment comprises, on the one hand, a direction switch 51 provided at the upper end of the guide tube 43 and consisting, in the manner described before, of a housing 52 and a rotary slide 53 mounted to be rotated inside the said housing whereby a tube section 54 arranged in the rotary slide can be brought into alignment selectively with the guide tube 43 or an inclined tube 55 opening into the housing 52 of the direction switch 51, and on the other hand an additional direction switch 61 consisting likewise of a cylindrical housing 62 and a rotary slide accommodated therein and provided with a tube section 64 that can be brought into alignment selectively either with the inclined tube 55 or with a sample-receiving tube 65 opening into the housing 62 of the direction switch 61. The sample-receiving tube 65 extends substantially in vertical direction and may, for example, pass through the table top of the console or the control panel of the spectrometer of which the cryomagnet 41 forms a part. It will be readily seen that this arrangement provides the possibility to insert a sample carrier into the sample-receiving tube 65 from above, to lower it into the tube section 64 of the lower direction switch 61, to transport is thereafter—after the direction switch 61, 51 has been set correspondingly— via the inclined tube 55 into the tube section 54 of the upper direction switch, and to lower it finally, after the upper direction switch 51 has been actuated, into the guide tube 63 and there down to the homogenous area of the magnetic field generated by the cryomagnet 41, for carrying out the desired measurements.

There is no need to explain that the direction switches and the compressed-air supply may be operated manually, just as in the case of the embodiment illustrated in FIG. 1, and that it is also possible to couple mechanically the two direction switches provided at the upper and lower ends of the inclined tube 55. Likewise, it will be readily seen that the whole sample-changing process, from the insertion of a sample carrier into the sample-receiving tube 65, up to the positioning of the sample carrier in the measuring area of the cryomagnet 41 and, after completion of the measurement, the removal of the sample carrier from the measuring area and its deposition in the sample-receiving tube 65, can be controlled in response to control demands supplied by a control unit. The arrangement shown in FIG. 2 is adapted for such an automatic sample-changing process. To this end, the rotary slides 53 and 63 of the two direction switches 51 and 61 are provided each with one crank arm 71 and 72, respectively, whose ends are pivotally connected to the piston rods 73 and 74, respectively, of pneumatic cylinders 75 and 76. The pneumatic cylinders 75, 76 are supplied with compressed air from the arrangement 46 via lines 77 and 78. Control valves 81, 82 and 83, 84, respectively, determine if the compressed air is supplied to the forward or rear end of the piston of the pneumatic cylinder 75 or 76 and, accordingly, the direction in which the direction-changing switch is displaced. In the case of this embodiment of the invention, compressed air is supplied separately to the guide tube 43 and to the tube section 64 of the direction switch 61 arranged at the lower end of the inclined tube 55. The connection between the unit 46 supplying the compressed air and the tube section 64 is established by a flexible line 85. The supply of compressed air to the guide tube 43 and the tube section 64 is also controlled by a control valve 46 or 47 arranged in the corresponding line. When triggered by an external control command, by which a sample transport process is started, the control unit 67 initiates the steps required for introducing the sample carrier 44 from the sample-receiving tube 65 into the measuring position or for discharging the sample carrier from the measuring position to the sample-receiving tube 65, i.e. the steps of dosing the compressed air and reversing the direction switches, as described above in connection with FIG. 1, except that in the present case an additional step is required when the sample passes the direction switch 61. The individual steps of the sample transport process may be monitored by sensors 87, 88, 89 responding to the presence of the sample carrier 44 in the sample-receiving tube 65, in the tube section 64 of the lower direction switch 61, and in the tube section 54 of the upper direction switch 51. Such monitoring may in particular serve the purpose to ensure that the direction switches will not change position unless the sample carrier occupies one of these positions. The sensors 87 to 89 may simply consist of optical sensors which can be fitted particularly easily when the tubes of the device consist of a transparent material, in particular a transparent plastic material. In any case, the use of a transparent plastic material for the manufacture of the tubes of the device provides the advantage that the position of the sample and the operation of the device can be permanently supervised by visual inspection. Of course, the components of the direction switches may also be made from a transparent plastic material.

It is understood that the invention is not limited to the embodiments shown in the drawing, but that numerous variations may be made without leaving the scope and intent of the invention, it being essential for the invention that the use of direction switches and of tubes extending in a direction different from that of the guide tube passing through the cryomagnet enables the sample carrier to be transported to a position where the sample carrier can be easily positioned in, or removed from the end of the tube ending at this point. This may be achieved also, to a certain degree, by flexible and/or curved tubes, although it should, if possible, be avoided with respect to the arrangement of the sample that the sample carrier is turned upside down during its movement. As regards the supply of air and the position of the direction switches it is a matter of course that the individual tube portions must be passed by the sample carrier successively in the direction to or from the measuring area and that the direction switches must be set in each case to allow such movement. It is also a matter of course that the direction switches may be differently designed and/or may be operated by different actuating means, for example by means of Bowden cables, even though the switching means according to the invention distinguish themselves by a particularly simple and space-saving design.

I claim:
1. Device for positioning a sample carrier in an NMR spectrometer comprising an intense-field cryomagnet with vertically arranged axis producing a homogeneous static magnetic field in a predetermined measuring area, and a vertical guide tube passing through the said measuring area and carrying at its upper end a sample-changing device for transporting and removing a sample carrier to or from the guide tube, and comprising further and arrangement for supplying pressurized gas to the lower end of the guide tube by means of which the gas quantity supplied to the guide tube can be measured in such a manner that a sample carrier, having been transferred to the guide tube, can be selectively lowered from the upper end of the guide tube to the measuring area of the cryomagnet, for performing a measurement, and raised subsequently to the upper end of the guide tube for removing the sample carrier, characterized in that the said sample-changing device comprises an inclined tube leading from a point neighboring the upper end of the guide tube to an easily accessible point outside the said magnet arrangement where it is provided with an opening with a closure for inserting and removing the said sample carrier, and further a direction switch comprising a tube section that can be brought into alignment selectively with the said guide tube or with the said inclined tube, and that the device for supplying the pressurized gas is connected also to the closed lower end of the said inclined tube and can be controlled in such a manner that the said sample carrier, after having been raised in the said guide tube into the area of the direction switch in the condition where the tube section is aligned with the guide tube, can be lowered for removing the sample, after changing-over the position of the direction switch in the inclined tube, and vice versa.

2. Device according to claim 1, characterized in that a unilaterally closed, detachable end piece comprising a chamber for receiving the said sample carrier is arranged at the lower end of the said inclined tube.

3. Device according to claim 2, characterized in that the said end piece is fixed detachably on the lower end of the said inclined tube.

4. Device according to claim 2, characterized in that the said end piece is formed by the tube section of another direction switch which is connected to an upwardly open tube intended for receiving the sample carrier and extending substantially in vertical direction.

5. Device according to claim 4, characterized in that the said additional direction switch is coupled mechanically with the direction switch arranged at the upper end of the said guide tube.

6. Device according to claim 2, characterized in that the said direction switch comprises a movable section for closing the other tube tightly when the tube section of the said direction switch is in alignment either with the said guide tube or with the said inclined tube, and that the said guide tube is connected to the closed end of the said end piece by a flexible line connected to the said guide tube at a distance from its upper end which is at least equal to the length of the sample carrier.

7. Device according to claim 1, characterized in that the said direction switch can be operated manually by means of a lever mechanism forming together with the said direction switch an overall system which in the operating positions, in which the said direction switch is aligned either with the said guide tube or with the said inclined tube, has its center of gravity located lower than in all intermediate positions.

8. Device according to claim 1, characterized in that the said direction switch and the means for supplying compressed air are automatically adjusted, i.e. controlled, by a control unit in response to sensors arranged in the area of the direction switches.

* * * * *